United States Patent
Huang

(10) Patent No.: US 10,217,699 B2
(45) Date of Patent: Feb. 26, 2019

(54) PREFORMED LEAD FRAME

(71) Applicant: Chang Wah Technology Co., Ltd., Kaohsiung (TW)

(72) Inventor: Chia-Neng Huang, Kaohsiung (TW)

(73) Assignee: Chang Wah Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/676,932

(22) Filed: Aug. 14, 2017

(65) Prior Publication Data

US 2018/0190574 A1    Jul. 5, 2018

(30) Foreign Application Priority Data

Dec. 29, 2016 (TW) .............................. 105219900 U

(51) Int. Cl.
| | |
|---|---|
| *H01L 23/495* | (2006.01) |
| *H01L 23/498* | (2006.01) |
| *H01L 21/48* | (2006.01) |
| *H01L 21/56* | (2006.01) |

(52) U.S. Cl.
CPC .... *H01L 23/49541* (2013.01); *H01L 21/4828* (2013.01); *H01L 23/49503* (2013.01); *H01L 23/49517* (2013.01); *H01L 23/49537* (2013.01); *H01L 23/49548* (2013.01); *H01L 23/49579* (2013.01); *H01L 23/49582* (2013.01); *H01L 23/49861* (2013.01); *H01L 21/561* (2013.01); *H01L 2224/48091* (2013.01)

(58) Field of Classification Search
CPC ......... H01L 23/49541; H01L 23/49503; H01L 23/49517; H01L 23/49537; H01L 23/49548; H01L 23/49579; H01L 23/49582; H01L 23/49861; H01L 21/4828; H01L 21/561; H01L 2224/48091

See application file for complete search history.

(56) References Cited

U.S. PATENT DOCUMENTS

| | | | |
|---|---|---|---|
| 2007/0040231 A1* | 2/2007 | Harney | B81B 7/007 257/415 |
| 2011/0244629 A1* | 10/2011 | Gong | H01L 21/4828 438/112 |
| 2012/0061809 A1* | 3/2012 | Toda | H01L 23/3121 257/666 |
| 2012/0306065 A1* | 12/2012 | Bin Mohd Arshad | H01L 23/49548 257/676 |
| 2014/0001616 A1* | 1/2014 | Daniels | H01L 24/97 257/676 |

(Continued)

*Primary Examiner* — Sitaramarao S Yechuri
(74) *Attorney, Agent, or Firm* — DLA Piper LLP (US)

(57) ABSTRACT

A preformed lead frame includes a plurality of lead frame units and intersecting cutting paths extending between two adjacent rows of said lead frame units, and a molding layer. Each of the lead frame units includes a die pad, and a plurality of spaced-apart leads. Each of the cutting paths has a plurality of metallic connecting portions and etched grooves. The molding layer embeds the lead frame units and the connecting portions. Each of the etched grooves is indented from the top surface of the molding layer. A top open end of each of the etched grooves includes two opposite curved edges respectively meeting an adjacent one of the leads of one of the lead frame units and an adjacent one of the leads of the other one of the lead frame units.

2 Claims, 9 Drawing Sheets

(56) References Cited

U.S. PATENT DOCUMENTS

| | | | |
|---|---|---|---|
| 2016/0148877 A1* | 5/2016 | Kitnarong | H01L 21/4839 |
| | | | 257/666 |
| 2016/0254214 A1* | 9/2016 | Makino | H01L 24/97 |
| | | | 257/676 |
| 2016/0365413 A1* | 12/2016 | Wagner | H01L 29/1095 |
| 2017/0033271 A1* | 2/2017 | Gruendl | H01L 33/486 |
| 2017/0301617 A1* | 10/2017 | Lin | H01L 23/49861 |

* cited by examiner

PREFORMED LEAD FRAME

CROSS-REFERENCE TO RELATED APPLICATION

This application claims priority of Taiwanese Utility Model Patent Application No. 105219900, filed on Dec. 29, 2016.

FIELD

The disclosure relates to a lead frame, and more particularly to a preformed lead frame formed with intersecting cutting paths that extend among lead frame units and that are provided with connecting portions embedded in a molding layer.

BACKGROUND

A conventional flat no-lead package has no pins extending beyond edges of the package. Thus, it is beneficial for the flat no-lead package to have a size smaller than that of a leaded chip carrier package including a plurality of pins extending outwardly. However, exposed surfaces of the pins along the edges of the package may not provide sufficient wettable flanks to provide reliable electrical and mechanical connections to an external component, such as a printed circuit board (PCB) during a subsequent reflow soldering process.

Referring to FIG. 1, in order to improve the connection between the pins of the flat no-lead package and the external component, U.S. Patent Application Publication No. 2016/0148877 A1 discloses a method for manufacturing an integrated circuit (IC) device in a quad flat no-lead (QFN) package and an IC device in a QFN package made from the same. The method includes encapsulating a lead frame formed with a rib connecting a plurality of pins 12 and an IC chip mounted on the leadframe, cutting a step cut into the encapsulated leadframe to form a groove 13 using a first saw width without separating a bonded IC package from the rib, forming an electroplated coating 14 on the exposed pins 12, and cutting the bonded IC package free from the rib using a second saw width less than the first saw width.

Formation of the step cut may increase the wettable flanks to enhance electrical and mechanical connections of the IC package to the external component during the reflow soldering process but involves the two cutting steps that are carried out posterior to the encapsulating operation of the lead frame and the IC chip. The manufacturing cost is relatively high and the manufacturing process is relatively complicated.

SUMMARY

Therefore, an object of the disclosure is to provide a preformed lead frame that can alleviate at least one of the drawbacks of the prior art.

According to the disclosure, the preformed lead frame includes a plurality of lead frame units arranged in intersecting rows, a plurality of intersecting cutting paths, and a molding layer.

Each of the lead frame units includes at least one die pad, and a plurality of spaced-apart leads.

Each of the cutting paths extends between two adjacent rows of the lead frame units and has a plurality of spaced-apart metallic connecting portions, and a plurality of spaced apart etched grooves. Each of the metallic connecting portions is connected between an adjacent one of the leads of one of the leads frame units and an adjacent one of the leads of the other one of the lead frame units.

The molding layer embeds the die pads and the leads of the lead frame units and the metallic connecting portions of the cutting paths. The molding layer has a top surface exposing a top surface of each of the die pads and each of the leads, and a bottom surface exposing a bottom surface of each of the die pads and each of the leads, and bottom surfaces of the metallic connecting portions.

Each of the metallic connecting portions extends upwardly from the bottom surface of the molding layer to a level than lower than the top surface of the molding layer. Each of the etched grooves is indented from the top surface of the molding layer and confined between an adjacent one of the leads of one of the lead frame units and an adjacent one of the leads of the other one of the lead frame units, and is located immediately above one of the metallic connecting portions.

Each of the etched grooves has a top open end, a bottom end opposite to the top open end and bordered by a top surface of one of the metallic connecting portions, and two opposite lateral ends connecting between the top open end and the bottom end. The lateral ends are respectively bordered by lead lateral surfaces of two of the leads, which are connected to the one of the metallic connecting portions. The lead lateral surfaces extend downwardly from the top open end to the bottom end and cooperate with the bottom end to form a curved surface concave relative to the top open end.

The top open end of each of the etched grooves includes two opposite curved edges respectively meeting the adjacent one of the leads of the one of the lead frame units and the adjacent one of the leads of said the other one of the lead frame units.

The two opposite curved edges of the top open end of each of the etched grooves are respectively convex toward the adjacent one of the leads of one of the lead frame units and the adjacent one of the leads of the other one of the lead frame units.

Each of the curved edges of the top open end of each of the etched grooves has two end points and a vertex point, a distance between the vertex point and a phantom line passing the end points ranging from 5 μm to 50 μm.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
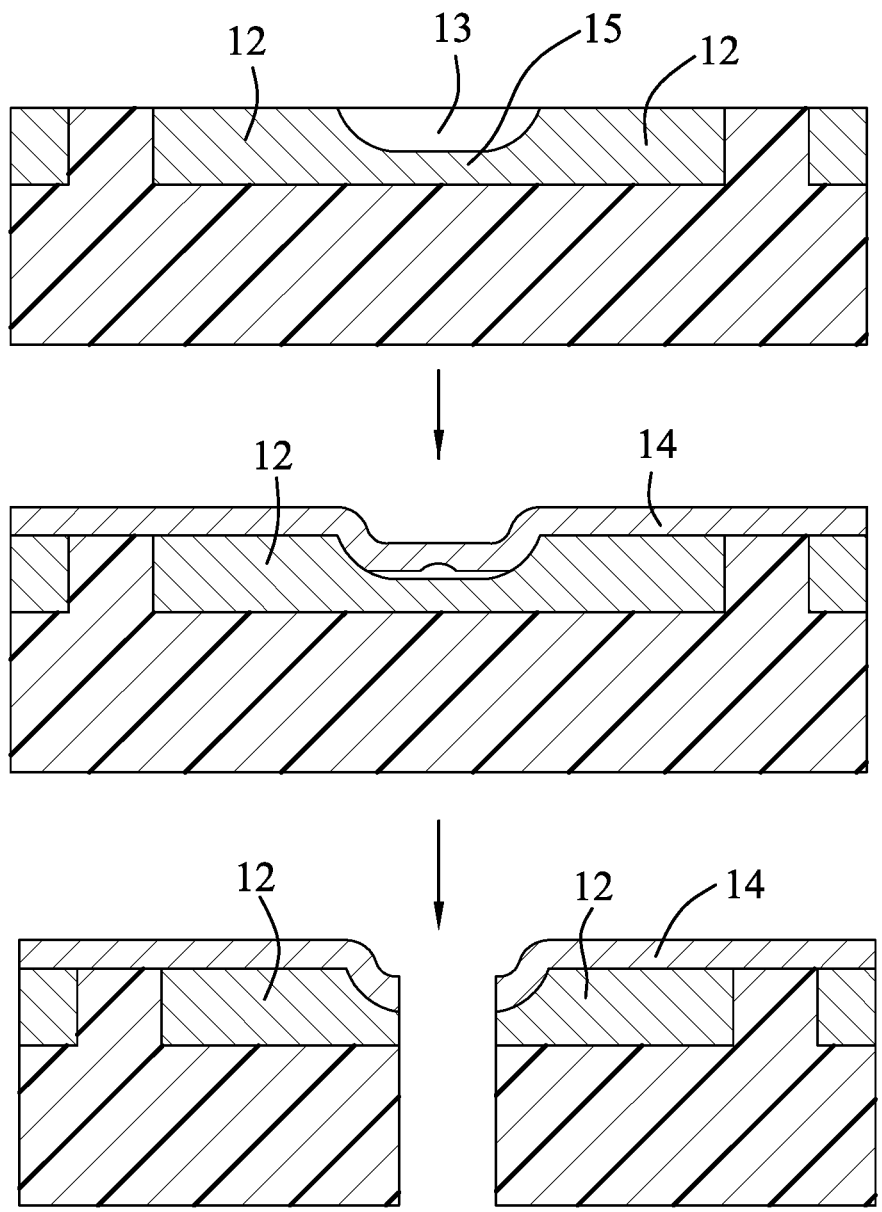
FIG. 1 is a schematic view illustrating consecutive steps of a method of making a conventional quad flat no-lead (GQFN) package abstracted from U.S. Patent Application Publication No. 2016/0148877 A1.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 2 to 5, an embodiment of a preformed lead frame 200A according to the disclosure includes a plurality of lead frame units 20A arranged in intersecting rows, a plurality of intersecting cutting paths 23 each extending between two adjacent rows of the lead frame units 20A, a molding layer 21, a first conductive layer 25, and a second conductive layer 26.

Each of the lead frame units 20A includes at least one die pad 22, and a plurality of spaced-apart leads 24.

Each of the intersecting cutting paths 23 has a plurality of spaced-apart metallic connecting portions 230, and a plurality of spaced-apart etched grooves 232. Each of the metallic connecting portions 230 is connected between an adjacent one of the leads 24 of one of the lead frame units 20A and an adjacent one of the leads 24 of the other one of the lead frame units 20A.

The molding layer 21 embeds the die pads 22 and the leads 24 of the lead frame units 20A and the metallic connecting portions 230 of the cutting paths 23. The molding layer 21 has a top surface 213 and a bottom surface 214. The top surface 213 of the molding layer 21 exposes a top surface 221 of each of the die pads 22 and a top surface 243 of each of the leads 24. The bottom surface 214 of the molding layer 21 exposes a bottom surface 222 of each of the die pads 22, a bottom surface 244 of each of the leads 24, and bottom surfaces 235 of the metallic connecting portions 230. In the embodiment, the molding layer 21 is exemplified to be made from a polymeric material.

Each of the metallic connecting portions 230 extends upwardly from the bottom surface 214 of the molding layer 21 to a level lower than the top surface 213 of the molding layer 21. In the embodiment, the die pads 22, the leads 24, and the connecting portions 230 are exemplified to be made of the same metal material.

Each of the etched grooves 232 is indented from the top surface 213 of the molding layer 21, confined between an adjacent one of the leads 24 of one of the lead frame units 20A and an adjacent one of the leads 24 of the other one of the lead frame units 20A, and located immediately above a respective one of the metallic connecting portions 230.

Each of the etched grooves 232 has a top open end 2321, a bottom end 2322 opposite to the top open end 2321 and bordered by a top surface 231 of one of the metallic connecting portions 230, and two opposite lateral ends 2323 connecting between the top open end 2321 and the bottom end 2322. The lateral ends 2323 are respectively bordered by lead lateral surfaces 241 of two of the leads 24, which are connected to the one of the metallic connecting portions 230. The lead lateral surfaces 241 extend downwardly from the top open end 2321 to the bottom end 2322 and cooperate with the bottom end 2322 to form a curved surface concave relative to the top open end 2321.

The top open end 232 of each of the etched grooves 232 includes two opposite curved edges 2324 respectively meeting the adjacent one of the leads 24 of one of the lead frame units 20A and the adjacent one of the leads 2 of the other one of said lead frame units 20A.

The two opposite curved edges 2324 of the top open end 2321 of each of the etched grooves 232 are respectively convex toward the adjacent one of the leads 24 of one of the lead frame units 20A and the adjacent one of the leads 24 of the other one of the lead frame units 20A. Each of the curved edges 2324 of the top open end 2321 of each of the etched grooves 232 has two end points (P1, P2) and a vertex point (P3), and a distance between the vertex point (P3) and a phantom line (L) passing the endpoints (P1, P2) ranges from 10 μm to 50 μm.

The first conductive layer 25 is formed on the top surfaces 221 of the die pads 22 of the lead frame units 20A, the top surfaces 243 of the leads 24 of the lead frame units 20A, the top surfaces 231 of the metallic connecting portions 230, and the lead lateral surfaces 241 of the leads 24 of the lead frame units 20A. The second conductive layer 26 is formed on the bottom surfaces 222 of the die pads 22 of the lead frame units 20A, the bottom surfaces 244 of the leads 24 of the lead frame units 20A, and the bottom surfaces 235 of the metallic connecting portions 230.

Figure 3:
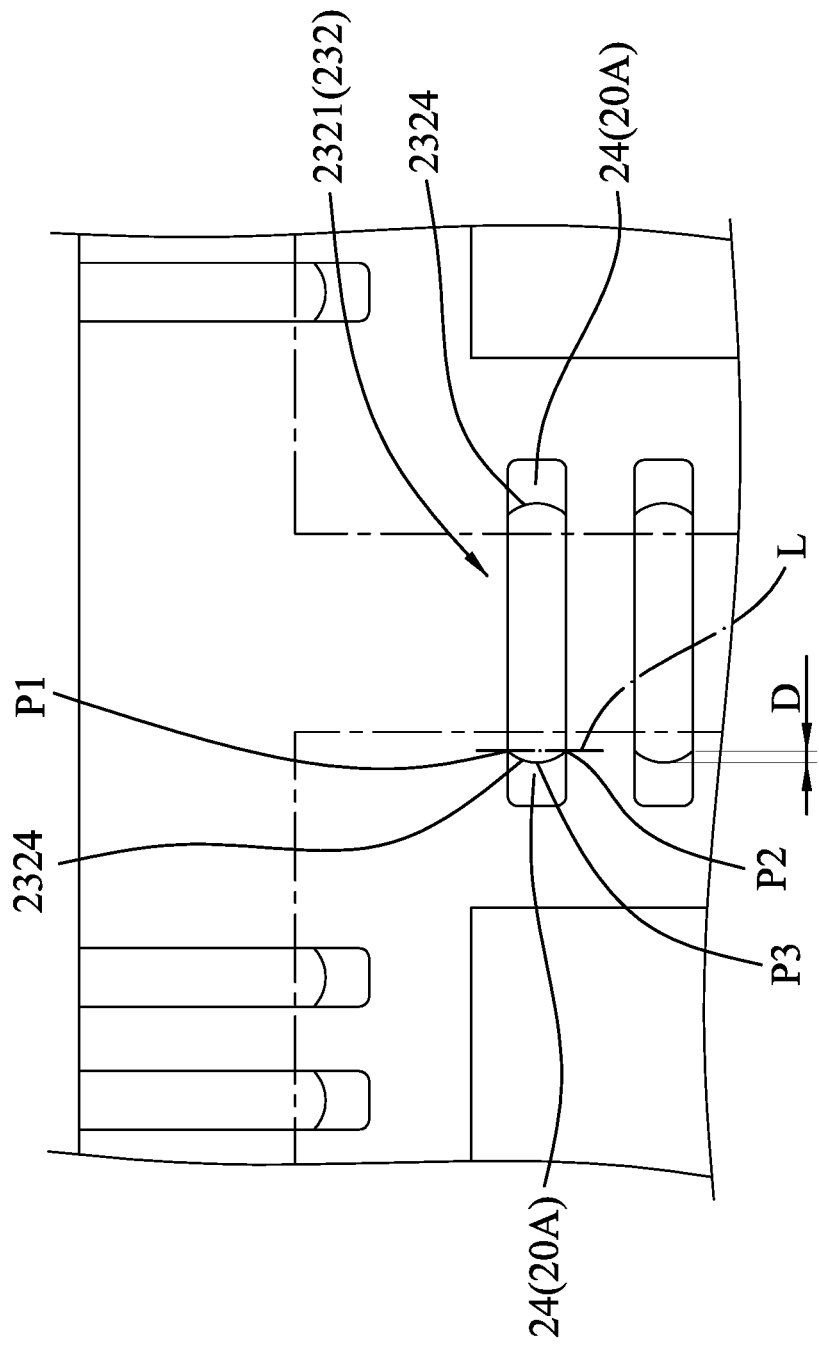
FIG. 3 is a partially enlarged top view of FIG. 2.
Figure 4:
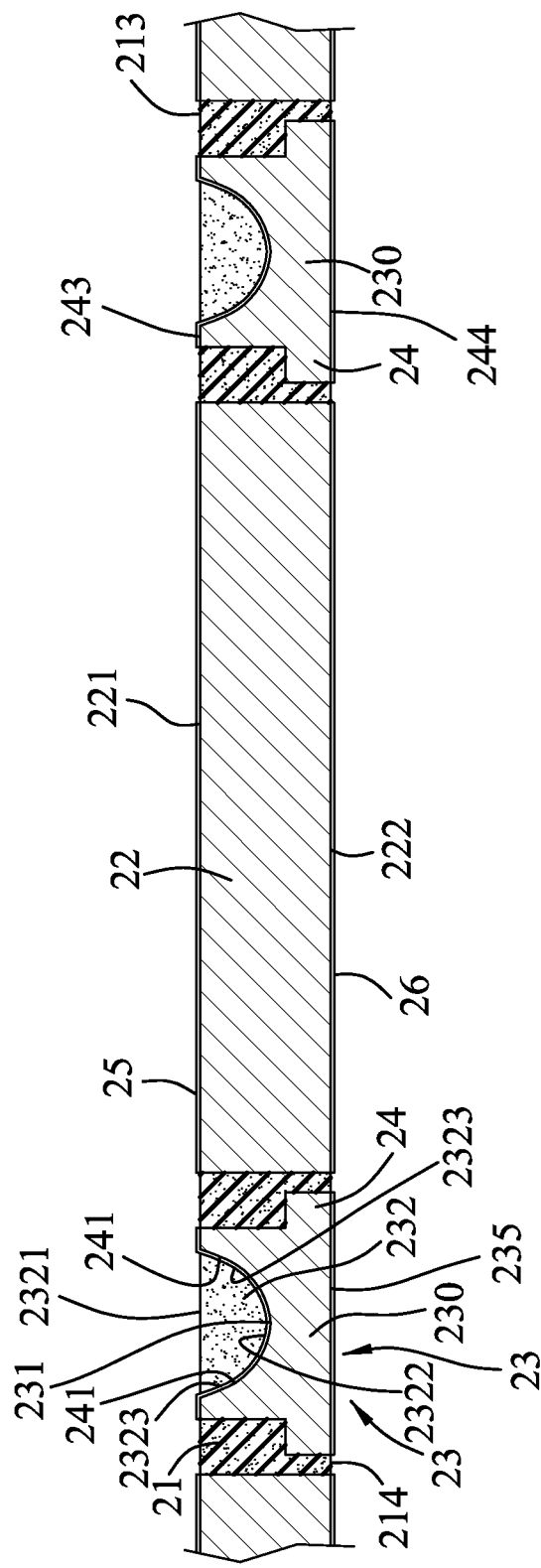
FIG. 4 is a fragmentary cross-sectional view taken along line IV-IV of FIG. 2.
Figure 5:
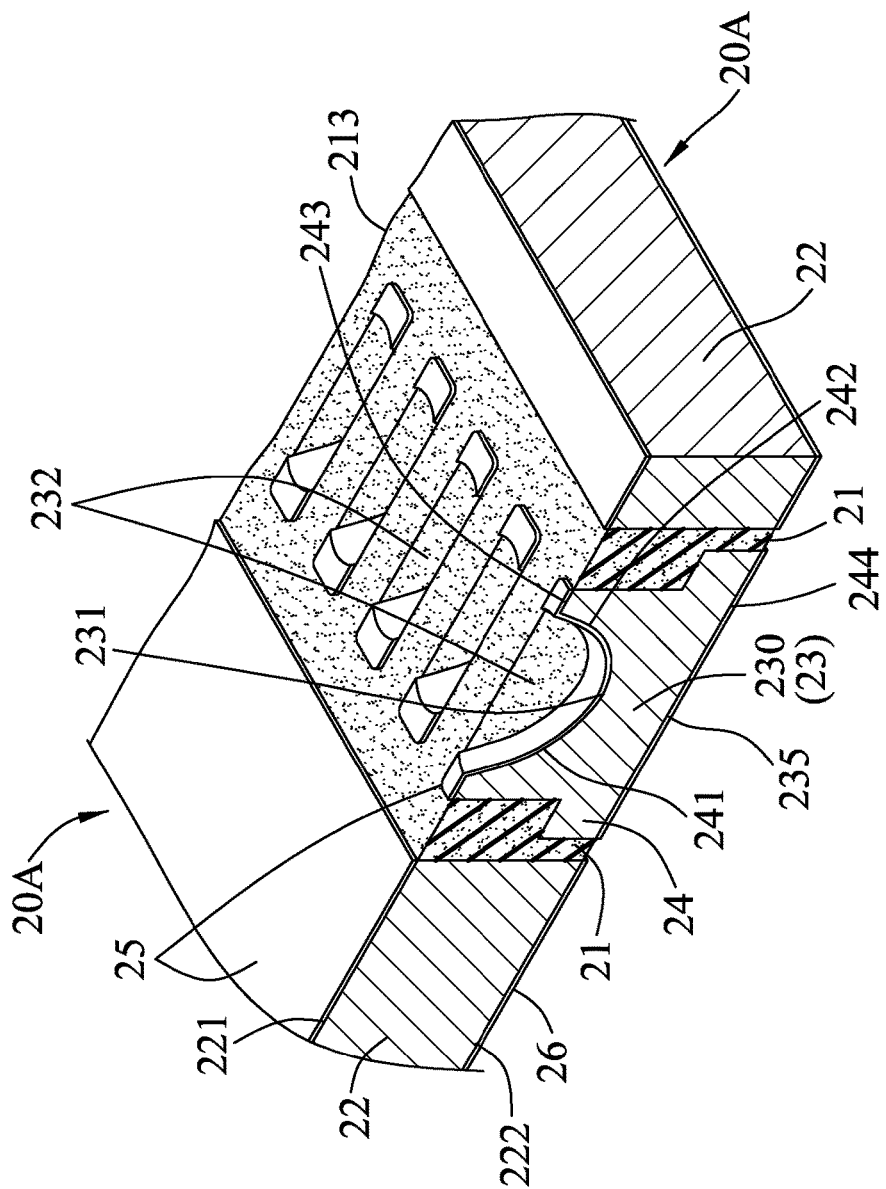
FIG. 5 is a fragmentary perspective view illustrating etched grooves formed in the preformed lead frame of the disclosure.
Figure 6:
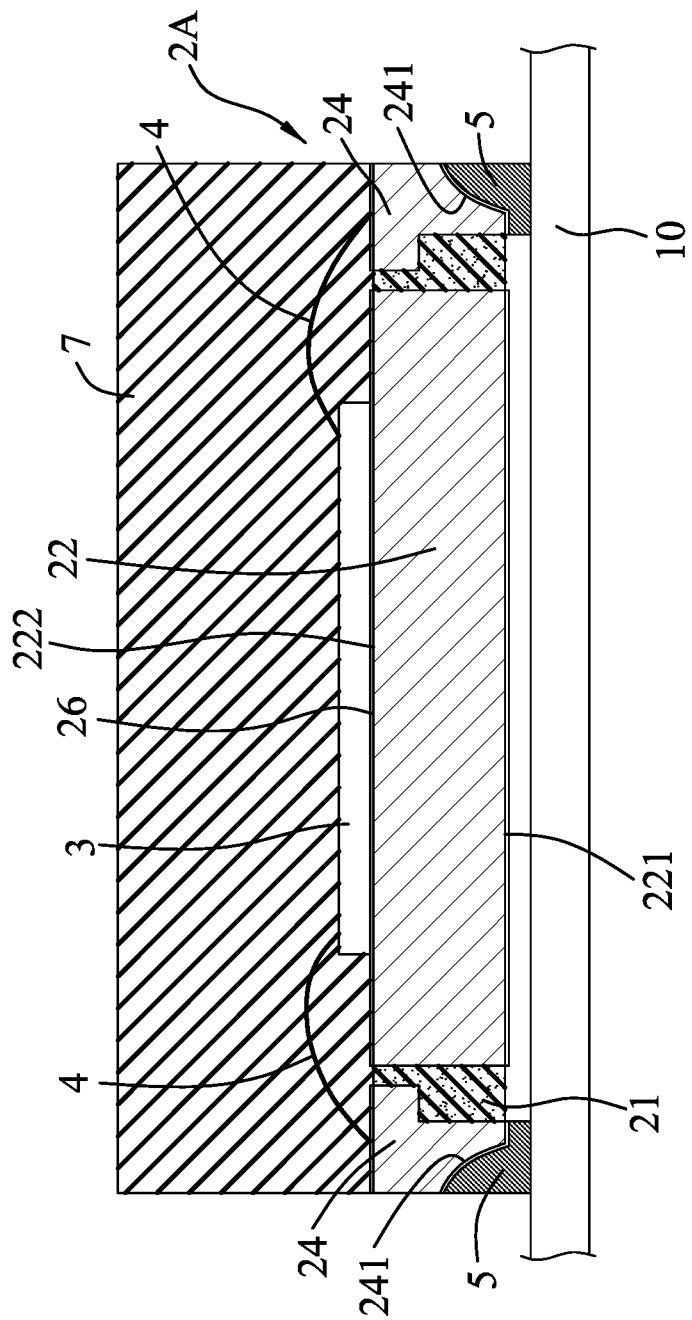
FIG. 6 is a fragmentary schematic view illustrating mounting of the embodiment of the preformed lead frame to a printed circuit board.

Referring to FIG. 6, when the preformed lead frame 200A of the embodiment is used for forming a plurality of lead frame packages 2A, semiconductor chips 3 are respectively disposed on the bottom surfaces 222 of the die pads 22 of the lead frame units 20A through the second conductive layer 26, followed by connecting wires 4 between the semiconductor chips 3 and the leads 24 in each of the lead frame units 20A using wire bonding techniques. Thereafter, the preformed lead frame 200A, the semiconductor chips 3 and the wires 4 are cooperatively encapsulated to form the plurality of the lead frame packages 2A, and then the lead frame packages 2A are singularized by dicing along the cutting paths 23 (as shown in FIG. 3).

Finally, the lead frame packages 2A are mounted to at least one printed circuit board 10 using soldering techniques. With the bent sections 242 of the leads 24 of the lead frame units 20A, a contact area between a solder material and the lead frame packages 2A is increased so as to improve electrical and mechanical connections between the PCB 10 and the lead frame packages 2A.

Figure 7:
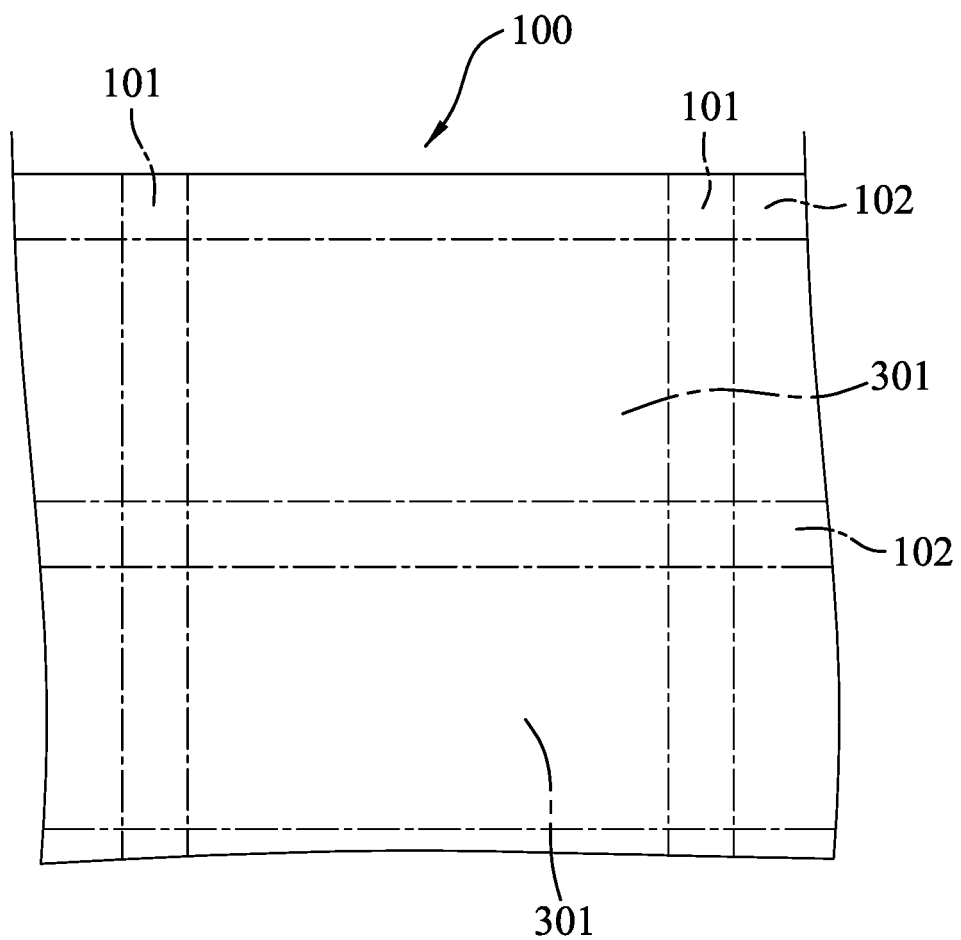
FIGS. 7 and 8 are fragmentary top views illustrating first few steps of a method of making the embodiment of the preformed lead frame according to the disclosure.
Figure 8:
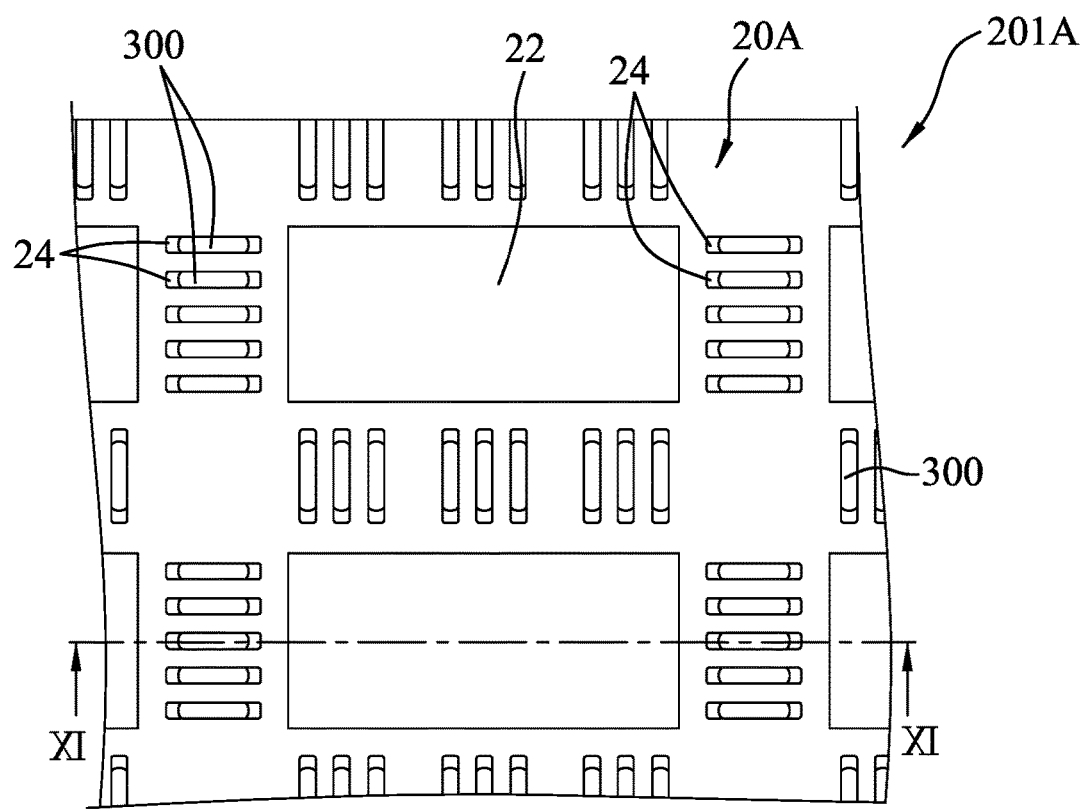
Figure 9:
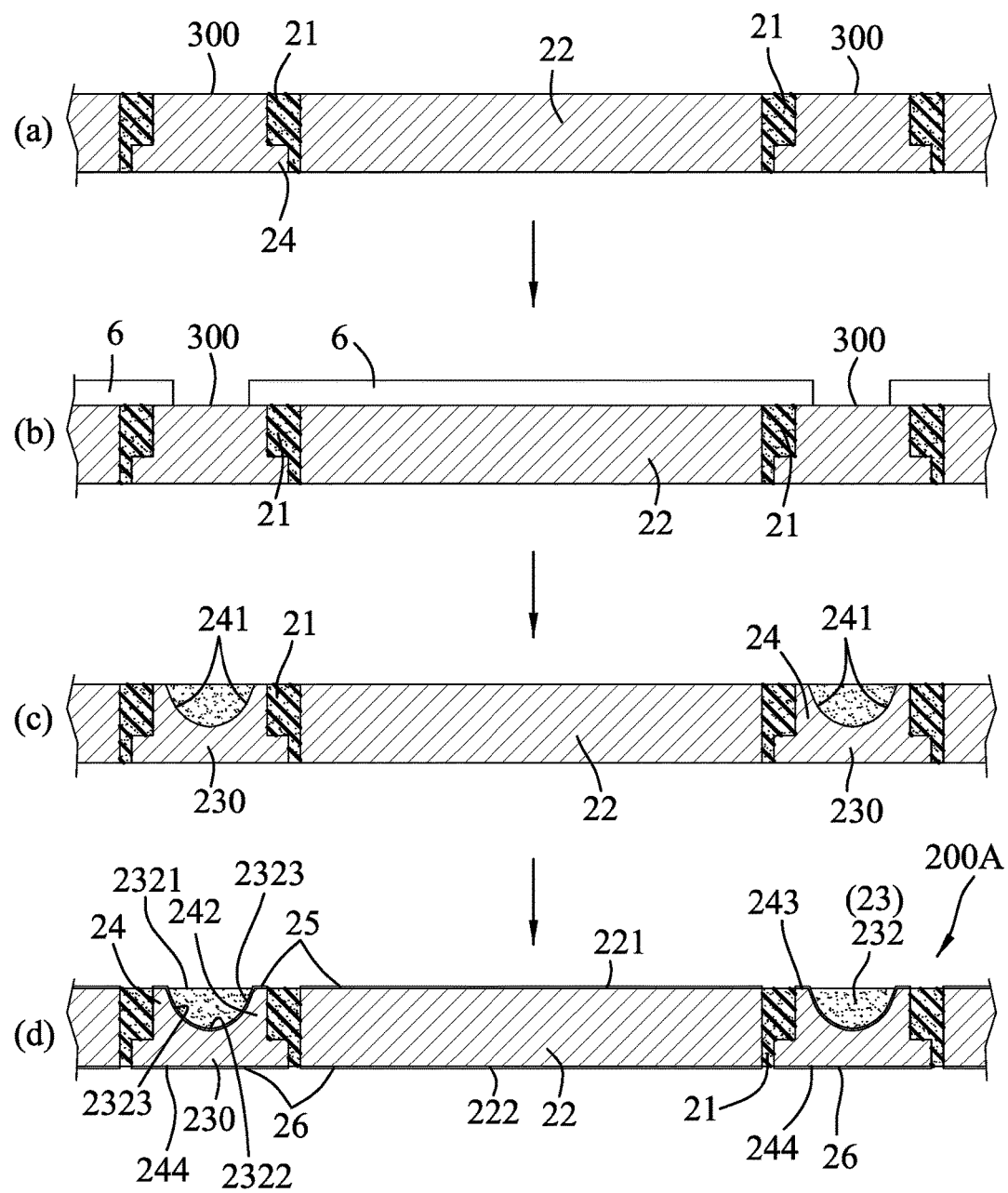
FIG. 9 is a fragmentary schematic view illustrating subsequent steps of the method.

Referring to FIGS. 7 to 9, a method of making the embodiment of a preformed lead frame 200A according to the disclosure is illustrated.

Figure 2:
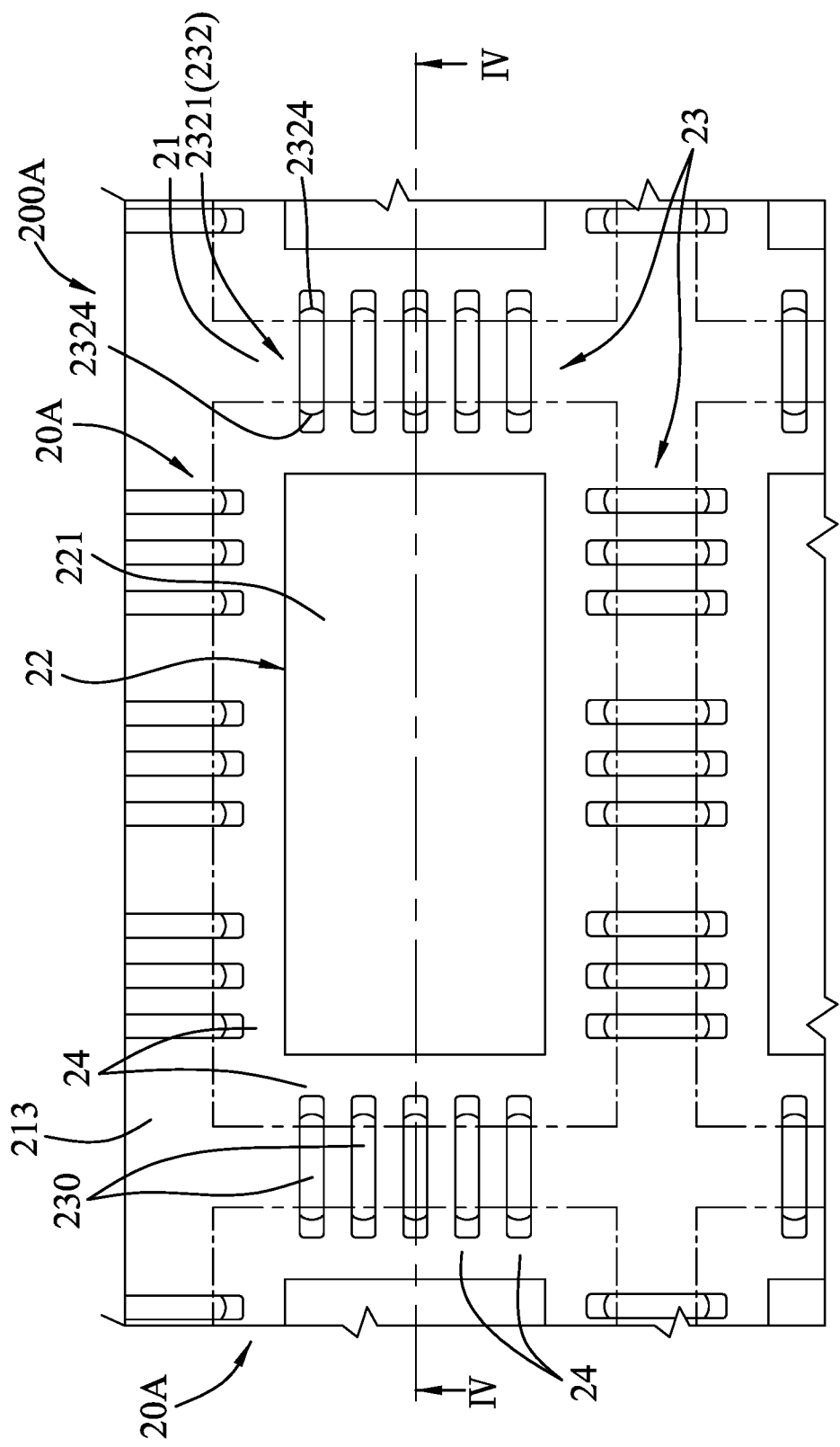
FIG. 2 is a fragmentary top view illustrating an embodiment of the preformed lead frame according to the disclosure.

First, an electrically conductive substrate 100 is provided. The electrically conductive substrate 100 is defined with longitudinal and transverse sections 101, 102 intersecting each other and a plurality of lead-frame-unit forming regions surrounded by the longitudinal and transverse sections 101, 102. The longitudinal and transverse sections 101, 102 correspond in position to the cutting paths 23 that are subsequently formed (as shown in FIG. 2). In the embodiment, the electrically conductive substrate 100 may be made of a metal sheet, such as copper, a copper-based alloy, an iron-nickel-based alloy and combinations thereof.

Then, an upper part of the electrically conductive substrate 100 is etched from a top surface to form an upper patterned trench, followed by filling the upper patterned trench with a molding material to form an upper molding layer 21. More specifically, the electrically conductive substrate 100 formed with the upper patterned trench is disposed in a mold (not shown), and then an encapsulating material selected from an insulating material, such as epoxy resin, is filled in the upper patterned trench 105, followed by curing the encapsulating material. Thereafter, a lower part of the electrically conductive substrate 100 is etched from a bottom surface of the electrically conductive substrate 100 to form the lower patterned trench. Subsequently, a lower molding layer is formed to fill the lower patterned trench using the aforesaid process that is mentioned in the formation step of the upper molding layer, so as to form the molding layer 21 including the upper and lower molding layers. Thus, a semi-product 201A (as shown in FIG. 11 (a)) that includes the lead frame units 20A and a plurality of pre-connecting portions 300, each of which interconnects two adjacent ones of the lead frame units 20A, is formed.

Thereafter, a mask layer 6 is formed on the semi-product 201A, and then the pre-connecting portions 300 are etched from top surfaces thereof until upper portions of the pre-connecting portions 300 are removed to form the connecting portions 230 (as shown in FIG. 3), followed by removing the mask layer 6. More specifically, the leads 24 are formed during the formation of the connecting portions 230.

Finally, the first conductive layer 25 is formed on the top surfaces 221 of the die pads 22 of the lead frame units 20A, the top surfaces 241 of the leads 24 of the lead frame units 20A, the top surfaces 231 of the connecting portions 230, and the lead lateral surfaces 241 of the leads 24 of the lead frame units 20A using electroplating techniques. The second conductive layer 26 is formed on the bottom surfaces 222 of the die pads 22, the bottom surfaces 244 of the leads 24, and the bottom surfaces 235 of the connecting portions 230 using electroplating techniques.

By virtue of the design of the curved surfaces formed by the lead lateral surfaces 241 of the leads 24 and the top open ends 2321 and the bottom ends 2322 of the etched grooves 232 and the curved edges 2324 of the top open ends 2321 of the etched grooves 232, the contact area between the solder material and the lead frame packages 2A is increased, thereby improving the electrical and mechanical connections between the lead frame packages 2A and the PCB 10. Moreover, by virtue of the design of the molding layer 21, the dicing process can be conducted relatively efficiently.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A preformed lead frame, comprising:
   a plurality of lead frame units arranged in intersecting rows, each of said lead frame units including at least one die pad, and a plurality of spaced-apart leads;
   a plurality of intersecting cutting paths, each of said cutting paths extending between two adjacent rows of said lead frame units, and having a plurality of spaced-apart metallic connecting portions and a plurality of spaced-apart etched grooves, each of said metallic connecting portions being connected between an adjacent one of said leads of one of said lead frame units and an adjacent one of said leads of the other one of said lead frame units; and
   a molding layer embedding said die pads and said leads of said lead frame units and said metallic connecting portions of said cutting paths, said molding layer having a top surface exposing a top surface of each of said die pads and a top surface of each of said leads, and a bottom surface exposing a bottom surface of each of said die pads and a bottom surface of each of said leads, and bottom surfaces of said metallic connecting portions,
   wherein each of said metallic connecting portions extends upwardly from said bottom surface of said molding layer to a level lower than said top surface of said molding layer, each of said etched grooves being indented from said top surface of said molding layer, being confined between an adjacent one of said leads of one of said lead frame units and an adjacent one of said leads of the other one of said lead frame units, and being located immediately above a respective one of said metallic connecting portions;
   wherein each of said etched grooves has a top open end, a bottom end opposite to said top open end and bordered by a top surface of one of said metallic connecting portions, two opposite side ends each connected between said top open end and said bottom end and bordered by said molding layer, and two opposite lateral ends each connected between said top open end and said bottom end and interposed between said side ends, said lateral ends being respectively bordered by lead lateral surfaces of two of said leads, which are connected to said one of said metallic connecting portions, said lead lateral surfaces extending downwardly from said top open end to said bottom end and cooperating with said bottom end to form a curved surface concave relative to said top open end;
   wherein said top open end of each of said etched grooves includes two opposite curved edges respectively meeting said adjacent one of said leads of said one of said lead frame units and said adjacent one of said leads of said the other one of said lead frame units;
   wherein said two curved edges of said top open end of each of said etched grooves are respectively convex toward said adjacent one of said leads of said one of said lead frame units and said adjacent one of said leads of said the other one of said lead frame units; and
   wherein each of said curved edges of said top open end of each of said etched grooves has two end points and a vertex point, a distance between said vertex point and a phantom line passing said end points ranging from 5 μm to 50 μm.

2. The preformed lead frame of claim 1, further comprising a first conductive layer and a second conductive layer, said first conductive layer being formed on said top surfaces of said die pads of said lead frame units, said top surfaces of said leads of said lead frame units, said top surfaces of said metallic connecting portions, and said lead lateral surfaces of said leads of said lead frame units, said second conductive layer being formed on said bottom surfaces of said die pads of said lead frame units, said bottom surfaces of said leads of said lead frame units, and said bottom surfaces of said metallic connecting portions.

* * * * *